United States Patent [19]

Fujimoto

[11] Patent Number: 4,581,743
[45] Date of Patent: Apr. 8, 1986

[54] SEMICONDUCTOR LASER HAVING AN INVERTED LAYER IN A STEPPED OFFSET PORTION

[75] Inventor: Akira Fujimoto, Hirakata, Japan

[73] Assignee: Omron Tateisi Electronics Co., Kyoto, Japan

[21] Appl. No.: 505,481

[22] Filed: Jun. 17, 1983

[30] Foreign Application Priority Data

| Jun. 18, 1982 | [JP] | Japan | 57-104774 |
| Jul. 14, 1982 | [JP] | Japan | 57-122774 |
| Jul. 14, 1982 | [JP] | Japan | 57-122775 |
| Jul. 16, 1982 | [JP] | Japan | 57-124253 |
| Aug. 16, 1982 | [JP] | Japan | 57-141807 |

[51] Int. Cl.$^4$ .............................................. H01S 3/19
[52] U.S. Cl. ...................................... 372/46; 357/17; 372/47
[58] Field of Search .................. 372/43, 44, 45, 46, 372/47; 357/17

[56] References Cited

U.S. PATENT DOCUMENTS 4,347,611  8/1982  Seifres et al. .......................... 372/45
4,456,999  6/1984  Sugino et al. .......................... 372/45

Primary Examiner—James W. Davie
Attorney, Agent, or Firm—Wegner & Bretschneider

[57] ABSTRACT

An active layer and semiconductor layers putting both sides of the active layer which constitute a double hetero junction construction in a semiconductor crystal comprise a semiconductor of the same kind of conductive type. The double hetero junction portion is formed with an offset portion by a stepped portion. The active layer in the offset portion is formed with a P-N junction portion in a lateral direction. The P-N junction portion is formed by an inverted layer in which different kinds of conductors are diffused in a region from the surface of the semiconductor crystal to the offset portion.

6 Claims, 6 Drawing Figures

SEMICONDUCTOR LASER HAVING AN INVERTED LAYER IN A STEPPED OFFSET PORTION

BACKGROUND OF THE INVENTION

This invention relates to a semiconductor laser, particularly, to a semiconductor laser wherein an active layer, and first and second semconductor layers having said active layer therebetween are respectively formed from a conductive semiconductor layer of the same kind, and a P-N junction portion is formed in the active layer by an inverted diffusion layer.

As is known, the semiconductor laser comprises a laser medium formed from a semiconductor crystal having a double hetero junction construction. According to the basic structure of the semiconductor crystal, a first semiconductor layer, an active layer and a second semiconductor layer are laminated on a substrate in said order to form a double hetero junction construction. That is, the forbidden gaps of the first and second semiconductor layers are greater than that of the active layer. In this junction construction, carriers injected from the first and second semiconductor layers into the active layer are confined in the active layer. As the result, recombination of the carriers in the active layer is carried out effectively. That is, laser oscillation takes place in the active layer.

To enhance the efficiency of recombination of the carrier in the active layer, it is necessary to increase density of the carrier injected into the active layer. The semiconductor layer is of a stripe construction. This stripe construction has its function to guide the carrier injected into the second semiconductor so that the carrier may be concentrated in a specific region of the active layer. Thereby, the active layer is formed with a web-like radiation region the longitudinal direction of which is controlled by the crystal ends and the lateral direction controlled by stripe width.

Since the refractive index of the active layer is greater than that of the first and second semiconductor layers, the light beam generated by recombination of the carrier is confined in the radiation region. Since both longitudinal ends (i.e. crystal ends) of the radiation region form a Fabry-Perot resonance surface, the light beam is subjected to resonance amplification in the radiation region, a part of which is put out. This is the known laser beam.

The laser oscillation in the radiation region has a longitudinal mode generated in a longitudinal direction and a lateral mode generated in a lateral direction. Preferably, these are single modes. It is possible for the longitudinal mode to take a single mode due to the FabryPerot resonance surface. However, the laternal mode depends the stripe construction. That is, the stripe construction must be the construction which can prevent propagation of the light beam in the lateral direction.

Incidentally, various kinds of stripe constructions which are intended to form the lateral mode into a single mode have been proposed. However, all of these are complicated to manufacture. For example, there is a construction in which a portion is irradiated to a region from the second semiconductor layer to the first semiconductor layer to form a high resistant layer. That is, this is the construction in which the high resistant layers are formed on both sides which leave a narrow stripe width. In this case, the manufacturing step of the semiconductor crystal involves a unique step which is the irradiation of proton, lacking in consistency. Further, the known transverse-junction stripe-geometry laser can be improved in consistency of manufacture, but it has a plurality of masking steps which form a diffusion layer and is complicated.

The foregoing considerations are based on demands for reduction in threshold current value and unification of oscillation mode in addition to the demand for higher output. That is, there is the problem of breakdown of crystal ends (Fabry-Perot resonance surfaces), and there is naturally a limitation in the increase the oscillation output by merely increasing a driving current.

In view of the foregoing, a semiconductor laser has been proposed in which the above-described stripe construction is employed to form a plurality of radiation regions in an active layer, and output light beams are totalized to provide a higher output.

However, in such a semiconductor laser as described above, since the stripe construction is added, a plurality of masking steps is required, as a consequence of which the manufacturing process becomes cumbersome. In addition, in the semiconductor laser of the type described, it is desirable that the spacing between the radiation regions be narrow. However, the spacing between the radiation regions can not be made smaller than the spacing limited by the photolithographic technique. Accordingly, it is difficult to provide a higher density radiation region.

Finally, there is a demand for development of a semiconductor laser which is provided with a function of scanning output light beams, as a function of the element itself.

As is known, in photo-electronic devices such as facsimilies, a photodeflector composed of electric optical elements, a movable mirror and the like are combined to scan the output light beams of the semiconductor laser.

However, in making the combination with the photodeflector, there are many problems which are hard to solve due to the complicated mechanism. To make effective use of advantages of the semiconductor laser, which are smallness in size and lightness in weight, which constitute the significant characteristics thereof, development of a semiconductor laser provided in the element itself with the function scanning output light beams has been eagerly waited.

BRIEF SUMMARY OF THE INVENTION

It is an object of the present invention to provide a semiconductor laser in which a lateral mode can be formed into a single mode.

It is a further object of the present invention to provide a semiconductor laser in which the manufacturing process can be simplified.

It is another object of the present invention to provide a semiconductor laser which renders high output operation possible.

It is a still further object of the present invention to provide a semiconductor laser which is provided a function to scan output light beams as a function of element itself.

In accordance with the present invention, there is formed a P-N junction portion in an active layer at an offset portion formed in a double hetero junction portion. Lateral propagation of light generated in said P-N junction portion is prevented by first and second semiconductor layers between which the active layer is put. That is, the lateral mode is single.

An inverted layer is formed merely by diffusion from a semiconductor crystal surface. That is, there are various inverted layers but in any of these, no complicated masking step is required.

Furthermore, a plurality of double hetero junction constructions may be simply obtained because of a multilamination of conductive semiconductor layers of the same kind. That is, P-N junction portions (radiation regions) are formed in a lateral row in a plurality of active layers at the offset portion. The spacing between the radiation regions corresponds to the thickness of a semiconductor layer laminated on both sides of each active layer. The thickness of a semiconductor layer can be smaller than a sub-micron which can be suitably set and is relatively smaller than the spacing limited by the photolithographic technique. Accordingly, higher density of the radiation region becomes realized. And, a semiconductor laser of high output may be obtained because of construction of a carrier injection electrode, and a beam scanning type semiconductor laser may also be obtained. That is, in the high output semiconductor laser, laser oscillations are carried out simultaneously at each of the P-N junction portions. Output light beams in the radiation regions may be totalized easily. In the beam scanning type semiconductor laser, the laser oscillation at the P-N junction portion is merely carried out in suitable order.

Finally, non-inverted layers are formed in both sides in a direction longitudinal to the active layer to thereby reduce absorption of light in the neighbourhood of the crystal end. That is, the breakdown limit of the crystal end increases to provide higher output.

Other and further objects of this invention will become obvious upon an understanding of the illustrative embodiments about to be described or will be indicated in the appended claims, and various advantages not referred to herein will occur to one skilled in the art upon employment of the invention in practice.

BRIEF DESDRIPTION OF THE DRAWINGS

DETAILED DESCRIPTION OF THE INVENTION

Figure 1:
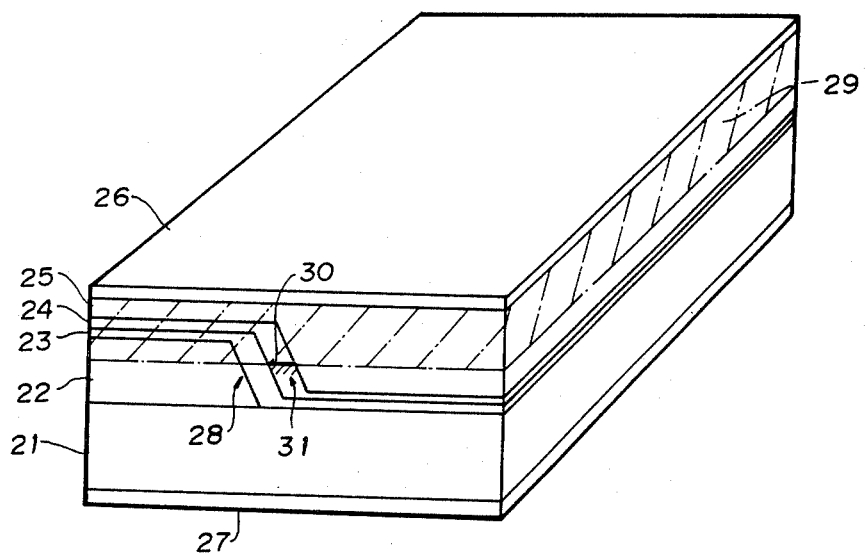
FIG. 1 is a schematic structural view showing a semiconductor laser in accordance with a first embodiment of the present invention.

FIG. 1 shows a semiconductor laser in accordance with a first embodiment of the present invention. In this semiconductor laser, a positive hole injection electelectrode 26 and an electron injection electrode 27 are provided on both surfaces, respectively, of a semiconductor crystal composed of the following semiconductor layers.

The aforementioned semiconductor crystal is composed a n-GaAs layer (substrate) 21, a GaAlAs layer 22, an nGaAlAs layer 23, an n-GaAs layer (active layer) 24 and an n-GaAlAs layer 25. In a junction portion (that is, a double hetero junction portion) between the active layer 24 and the semiconductor layers 23, 25 on both sides thereof, there is provided an offset portion 28. A P-type diffusion layer is provided on the side of the positive hole junction electrode 26.

The above-mentioned offset portion 28 is formed in the following manner. That is, the GaAlAs layer 22 is laminated in a predetermined thickness on the substrate 21. Thereafter, the GaAlAs layer 22 is partly removed by etching, to which the surface of the substrate 21 is exposed. That is, the offset portion 28 is formed by a stepped portion through a thickness of the GaAlAs layer 22. The GaAlAs layer 22 is obtained by doping an n-type conductive member or is not subjected to doping.

After the offset portion 28 has been formed in a manner as described above, the n-GaAlAs layer 23, the active layer 24 and the n-GaAlAs layer 25 are successively laminated. Thus, the injection portion is formed stepwise by the offset portion 28. The surface of the n-GaAlAs layer 25 is made substantially flat and horizontal due to the dependability in the surface direction of growth speed of crystal. This is the matter well known.

The aforesaid p-type diffusion layer 29 is constructed such that zinc is diffused in a region from the whole surface of the n-GaAlAs layer 25 to the active layer 24 in the offset portion 28. The boundary surface between the p-type inverted region and the n-type region is parallel to the surface of the n-GaAlAs layer 25. As a result, a P-N junction portion 30 of a predetermined width is laterally formed in the active layer 24 at the offset portion 28.

In the semiconductor laser constructed as described above, when a forward voltage is applied to both the electrodes 26, 27, a carrier of high density is injected into the P-N junction portion 30. Since both lateral sides of the P-N junction portion 30 are put between large potential barriers of the n-GaAlAs layers 23, 25, an injected carrier is confined in the P-N junction portion 30 without being diffused in a lateral direction and effectively recombined to generate induced emission light. As a consequence, a radiation region 31 is formed in the active layer 24 in the neighbourhood of the P-N junction portion 30. The light generated at the radiation region 31 is subjected to resonance amplification, with crystal ends on both longitudinal sides being FabryPerot resonance surfaces. At this time, the generated light is stopped by the n-GaAlAs layers 23, 25 of small refractive index and does not spread laterally. That is, the lateral mode can be made to be single.

In the manufacturing process of the semiconductor laser, zinc is merely diffused from the whole surface of the n-GaAlAs layer 25, and therefore, in formation of the p-type diffusion layer 29 and the positive hole injection electrode 26, a masking step is not required, thus simplifying the manufacturing process.

Figure 2:
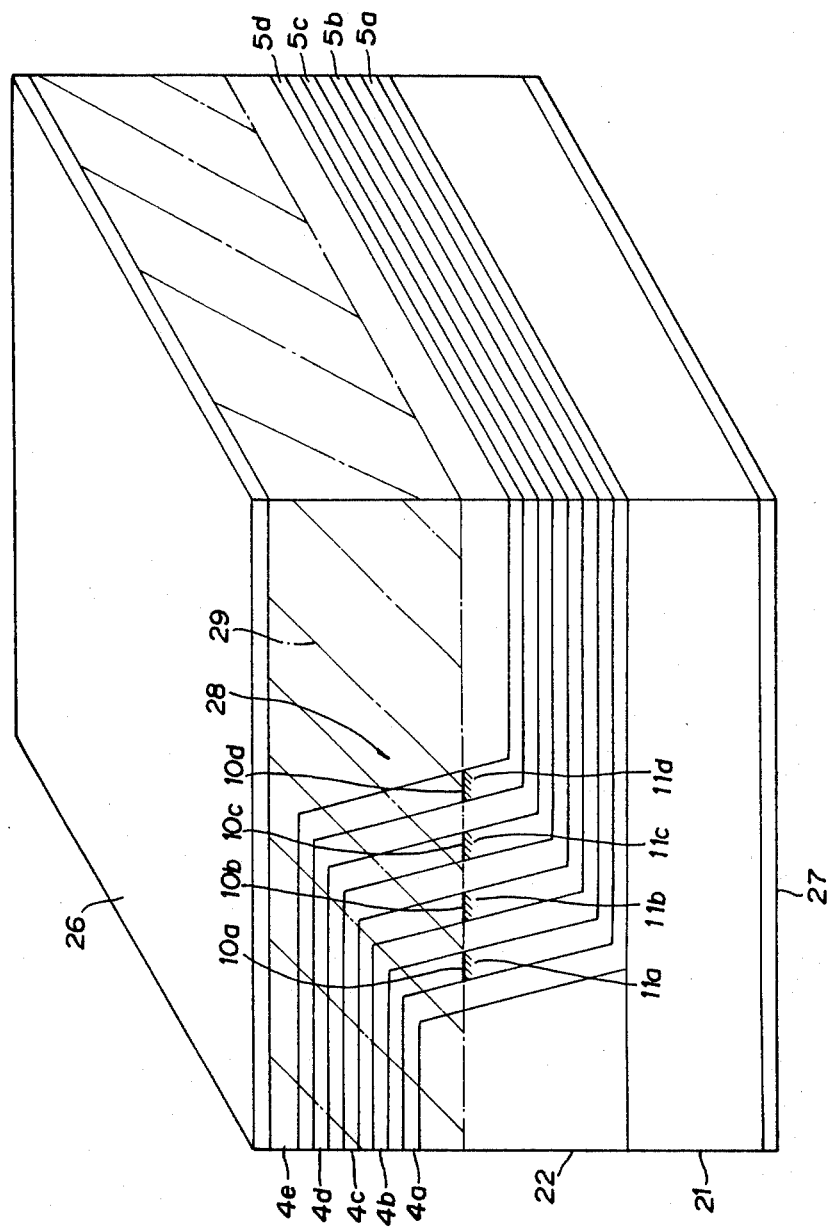
FIG. 2 is a schematic structural view showing a semiconductor laser in accordance with a second embodiment of the present invention.

FIG. 2 shows a semiconductor laser in accordance with a second embodiment of the present invention. In the second embodiment, parts corresponding to those of the above described first embodiment are designated by the same reference characters, and the explanation thereof will be omitted (the same is true for the following embdiments).

The semiconductor laser in accordance with the second embodiment has a plurality of double hetero junction constructions, which renders high output possible. That is, n-GaAs layer 4a and active layer (n-GaAs) 5a, which provide the hetero junction, are alternatively laminated (which are indicated by added characters, a, b, c, d, and e in FIG. 2), and a plurality (four in the illustrated embodiment) of hetero junction constructions is formed by each set of layers, (4a, 5a, 4b), (4b, 5b, 4c), (4c, 5c, 4d) and (4d, 5d, 4e). This junction portion is formed with an offset portion 28 similarly to the first embodiment. Zinc is diffused in a region from the whole surface of the uppermost layer (n-GaAlAs layer 4e) of said semiconductor) crystal to each active layer 5a, 5b, 5c, 5d in the offset portion 28 to form a p-type inverted layer 29. As a result, each layer of the offset portion 28 is formed with P-N junction portions in a row in a lateral direction.

In the semiconductor laser constructed as described above, a carrier is principally injected into P-N junction portions 10a, 10b, 10c and 10d formed in the active layers 5a, 5b, 5c and 5d among the P-N junction portions formed in the offset portion 28. This results from the fact that the energy gap of the GaAlAs layers 4a, 4b, 4c, 4d and 4e is greater than that of the active layers 5a, 5b, 5c and 5d. Since the P-N junction portions 10a, 10b, 10c and 10d each lie between hetero barriers of the GaAlAs layers 4a, 4b, 4c, 4d and 4e, the injected carrier is confined therein without being diffused in a lateral direction and effectively recombines to generate induced emission light to form radiation regions 11a, 11b, 11c and 11d. The spacing between the radiation regions 11a, 11b, 11c and 11d is determined in accordance with the thickness of the GaAlAs layers 4a, 4b, 4c and 4d. It is well known that the thickness of the semiconductor layer of the type as described can be suitably set in the range from a few microns to scores of microns depending on the growth speed and growth time of the crystals.

Figure 3:
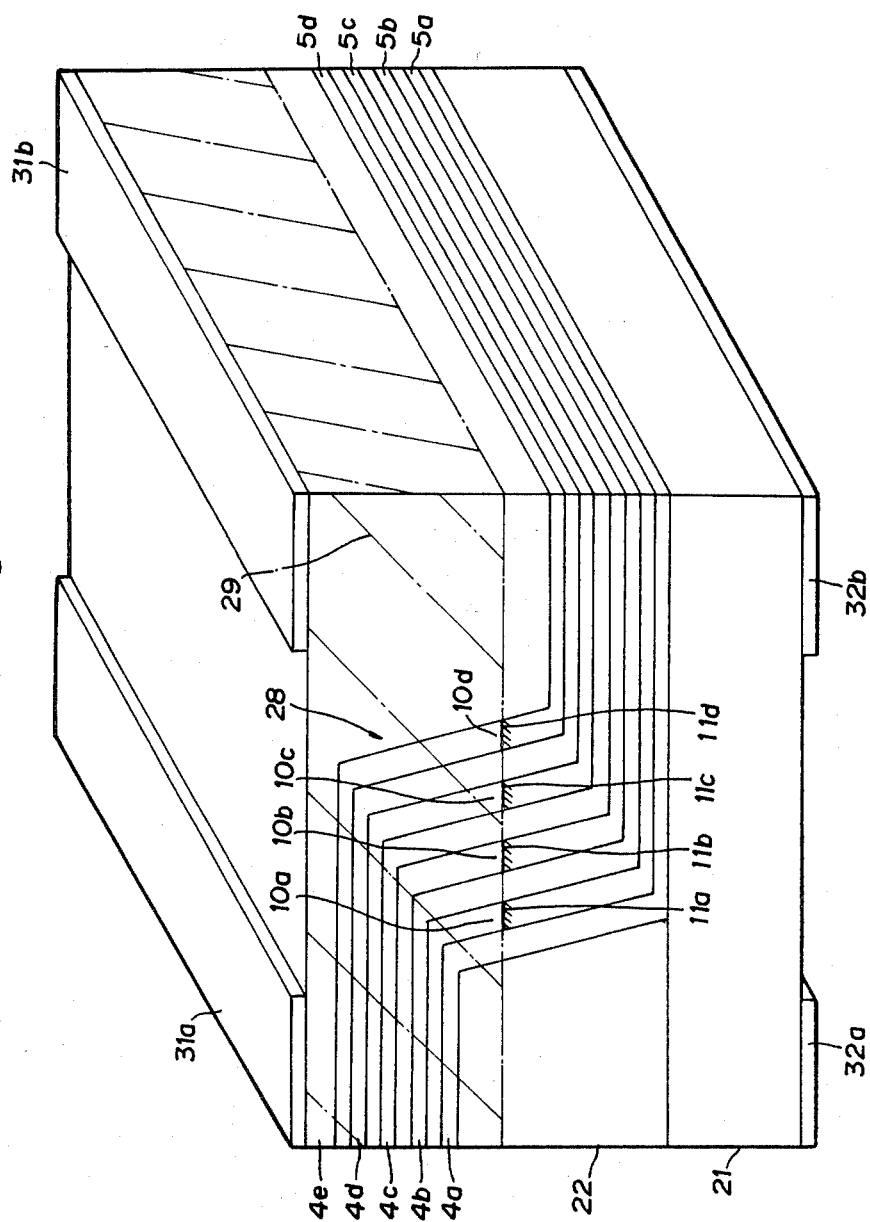
FIG. 3 is a schematic structural view showing a semiconductor laser in accordance with a third embodiment of the present invention.

FIG. 3 shows a semiconductor laser in accordance with a third embodiment of the present invention. In the semiconductor laser shown in the third embodiment, a construction of the carrier injection electrode in the strucure of the semiconductor laser shown in the abovedescribed second embodiment is modified.

That is, positive hole injection electrodes 31a, 31b and electron injection electrodes 32a, 32b are formed as strips on both lateral sides of a crystal surface distanced from the offset portion 28.

In the semiconductor laser constructed as described above, for example, when a forward bias voltage is applied between the electrodes 31a and 32a to cause a driving current to flow, the largest quantity of carriers is injected into the P-N junction portion 10a which is the shortest in current passage and the smallest in electric resistance. The passage of currrent is extended in order of the P-N junctions 10b, 10c and 10d and the electric resistance of passage increases, and the carriers to be injected decrease accordingly. That is, the laser oscillation is first effected at the P-N junction portion 10a, and as the driving current increases, the laser oscillation is effected in the order of the P-N junction portions 10b, 10c and 10d. And, when a forward bias is applied between the electrodes 31b and 32b to cause a driving current to flow, the laser oscillation can be effected in the order of the P-N junction portions 10d, 10c, 10b and 10a, conversely to the former. When a forward bias is applied between the electrodes 31a and 32b or between the 31b and 32a to cause a driving current to flow, many carriers are injected into the P-N junction portions 10b and 10c which are short in passage of current for the same reason as described hereinbefore, and in these junctions first takes place the laser oscillation. When the driving current is further increased, in the P-N junction portions 10a and 10d also takes place the laser oscillation.

By making use of the above-described principle, a driving current is first permitted to flow between the electrodes 31a and 32a to cause the P-N junction portion 10a to effect the laser oscillation. Next, the driving current between the electrodes 31a and 32a is cut off and the driving current is permitted to flow between the electrodes 31a and 32b or between the electrodes 31a and 32a to cause the P-N junction portions 10b and 10c to effect the laser oscillation. Finally, the driving current between the electrodes 31a and 32b or between the 31b and 32a is cut off and the driving current is permitted to flow between the electrodes 31b and 32b to cause the P-N junction portion 10d to effect the laser oscillation. In the manner as described above, the output beams can be operated in a lateral direction between the P-N junction portions 10a . . . 10d. In this case, the output beam is discontinuously moved in a lateral direction but the output beam can be moved smoothly by controlling the current value between the electrodes.

While in the above-described third embodiment, the carrier injected electrodes are provided on both lateral sides of the crystal surface distanced from the offset portion, it should be of course noted that the invention is not limited thereto but at least one carrier injected electrode can be a plurality of electrodes in the form of a strip in a laterally required spaced relation.

Next, a fourth embodiment (FIG. 4) and a fifth embodiment (FIGS. 5 and 6) will be described. These embodiment each concern the semiconductor laser in which the form of the inverted layer is varied in the structure of the semiconductor laser shown in the above-described first embodiment.

Figure 4:
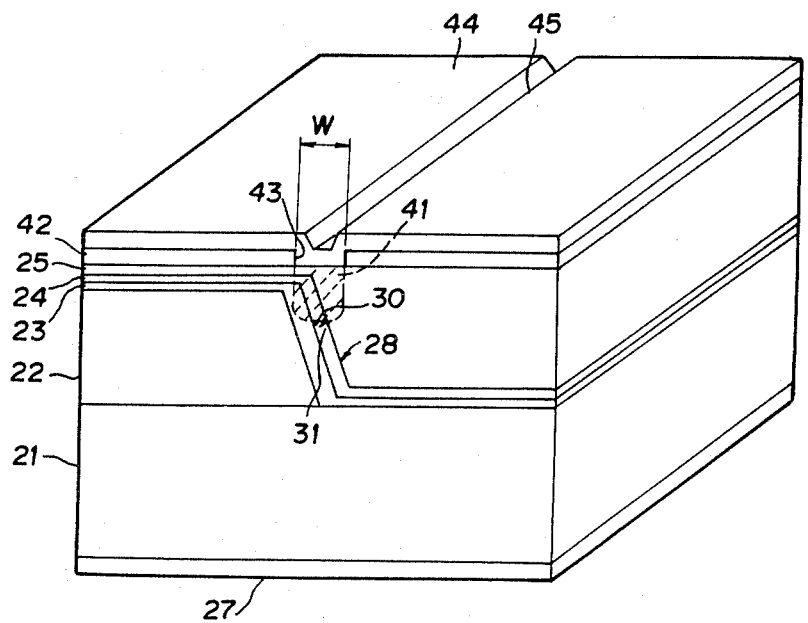
FIG. 4 is a schematic structural view showing a semiconductor laser in accordance with a fourth embodiment of the present invention.

Referring first to FIG. 4, a region from the surface of an n-GaAlAs layer 25 to an offset portion 28 is formed with an inverted layer 41 in the form of a web in a longitudinal direction with a width W which is slightly larger than a transverse width of an active layer 24.

The inverted layer 41 is formed by forming a diffusion hole 43 of a width W in the form of a web in a longitudinal direction in an insulated layer 42 laminated on the surface of the n-GaAlAs layer 25 and diffusing zinc from the surface of the n-GaAlAs layer 25 exposed thereto.

Thereafter, when an electrode layer 44 is formed on the insulated layer 42, a part dispersed in the diffusion hole 43 constitutes a positive hole injection electrode 45 without modification. Thus, the cumbersome masking step for forming the positive hole injection electrode 45 corresponding to the small width W of the inverted layer 41 is not required.

With this arrangement, the passage of the injected carrier is limited to the inverted layer 41 formed into a narrow web. That is, a defect in the crystal expected to be present in a part other than the inverted layer 41 is rarely affected by the injected carrier. In this manner, according to the semiconductor laser in the fourth embodimet, the number of defects in crystal involved in the inverted layer 41 is minimized to thereby reduce the effects caused by defects in the crystal. As the result, the reliability increases.

Figure 5:
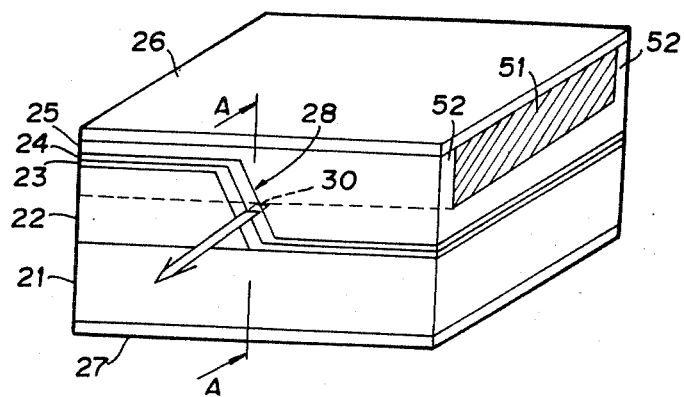
FIG. 5 is a schematic structural view showing a semiconductor laser in accordance with a fifth embodiment of the present invention.
Figure 6:
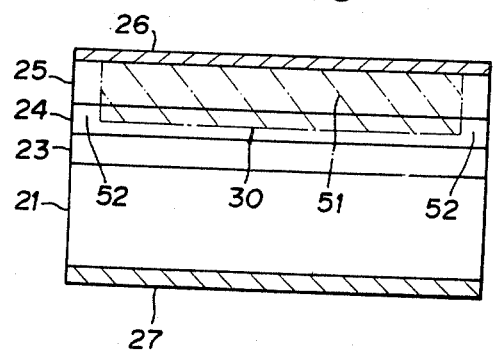
FIG. 6 is a sectional view taken on line A—A of FIG. 5.

Finally, in FIGS. 5 and 6, a p-type inverted layer 51 is diffused and formed leaving a non-inverted portion 52 in the neighbourhood of both longitudinal ends (namely, crystal ends in the form of a reflected mirror face) of the active layer 24.

It is known that generally, where a semiconductor material is the same, if the N-type is employed as the conductive type rather than the P-type, the effective band gap is large and light absorption is lesser. Thus, the light absorption at the non-inverted portion 52 is lesser than that shown in FIG. 1, and therefore, the breakdown limit of the crystal end increases.

That is, the semiconductor laser in accordance with the fifth embodiment is possible to obtain greater output light than the semiconductor laser in accordance with the first embodiment.

While in the above-described embodiments, the semiconductor lasers formed of the GaAs system compound semiconductors have been described, it should be noted of course that the invention is not limited thereto but it can be likewise applied to semiconductor lasers formed from other compound semiconductors.

What is claimed is:

1. A semiconductor laser comprising a semiconductor crystal having a double hetero junction formed by the lamination of an active layer between first and second semiconductor layers which are formed of a semiconductor of a first conductivity type;
said double hetero junction forming a stepped offset portion;
said active layer in said offset portion containing a single P-N junction formed laterally across the active layer and parallel to the surface of the crystal;
said P-N junction being formed by an inverted layer produced by the diffusion of conductors of a second conductivity type from the surface of said semiconductor crystal to said offset portion.

2. A semiconductor laser according to claim 1 wherein said semiconductor layer comprises an N-type semiconductor, and said inverted layer is formed by diffusing a P-type conductor.

3. A semiconductor laser according to claim 1 wherein said inverted layer is formed in the whole region from the surface of said semiconductor crystal to said offset portion.

4. A semiconductor laser according to claim 1 wherein said inverted layer is formed in the form of a web in the region from the surface of the semiconductor crystal to said offset portion, and the width of said web is slightly greater than the transverse width of said active layer.

5. A semiconductor laser according to claim 1 wherein said inverted layer has a non-inverted portion in the neighbourhood of ends on both longitudinal sides of said active layer.

6. A semiconductor laser according to claim 2 wherein said P-type conductor is zinc.

* * * * *